United States Patent
Engler et al.

(10) Patent No.: US 10,757,801 B2
(45) Date of Patent: Aug. 25, 2020

(54) SOLDER MASK VOID REGIONS FOR PRINTED CIRCUIT BOARDS

(71) Applicant: HEWLETT PACKARD ENTERPRISE DEVELOPMENT LP, Houston, TX (US)

(72) Inventors: David W. Engler, Cypress, TX (US); Stephen F. Contreras, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/126,424

(22) Filed: Sep. 10, 2018

(65) Prior Publication Data
US 2020/0084876 A1    Mar. 12, 2020

(51) Int. Cl.
H05K 1/02    (2006.01)
H05K 3/00    (2006.01)
H05K 3/28    (2006.01)

(52) U.S. Cl.
CPC .......... H05K 1/024 (2013.01); H05K 3/0005 (2013.01); H05K 3/28 (2013.01); H05K 1/0266 (2013.01); H05K 2201/09936 (2013.01)

(58) Field of Classification Search
CPC ........ H05K 1/024; H05K 3/0005; H05K 3/28; H05K 2201/09936; H05K 1/0266
USPC ...................................................... 174/251
See application file for complete search history.

(56) References Cited

U.S. PATENT DOCUMENTS

| | | | |
|---|---|---|---|
| 6,052,571 A | 4/2000 | Mishima | |
| 8,586,873 B2 | 11/2013 | Wu | |
| 9,560,762 B2 | 1/2017 | Oikawa | |
| 2001/0017768 A1* | 8/2001 | Rumsey | H05K 3/3452 361/760 |
| 2003/0183421 A1* | 10/2003 | Dishongh | H05K 1/113 174/262 |
| 2004/0003940 A1* | 1/2004 | Bai | H05K 3/28 174/258 |
| 2005/0139383 A1* | 6/2005 | Kent | H02J 7/0045 174/255 |

(Continued)

OTHER PUBLICATIONS

Riccardo Fiorelli, ST8500 Programmable Power Line Communication Modem System on Chip Design Guide, Dec. 2017, 2017 <http://www.st.com/content/ccc/resource/technical/document/application_note/group0/93/81/7e/d8/cd/4b/4f/68/DM00460188/files/DM00460188.pdf/jcr:content/translations/en.DM00460188.pdf >.

(Continued)

Primary Examiner — Sherman Ng
(74) Attorney, Agent, or Firm — Nolte Intellectual Property Law Group

(57) ABSTRACT

A printed circuit board having a substrate layer, at least one electrically conductive trace disposed on the substrate layer, and a solder mask layer disposed over the substrate layer and the electrically conductive trace, wherein the solder mask later includes a void region over at least a portion of the electrically conductive trace. Also, a method of optimizing printed circuit board designing including selecting printed circuit board data comprising at least a solder mask layer area, varying the solder mask layer area, determining an insertion loss value for each varied solder mask layer area, comparing the insertion loss values for each varied solder mask layer area, and selecting a solder mask layer area based on the comparing.

6 Claims, 11 Drawing Sheets

(56) References Cited

U.S. PATENT DOCUMENTS

2011/0091697 A1* 4/2011 Tseng .................. H05K 3/4007
428/209

OTHER PUBLICATIONS

The PCB Design Magazine, Mar. 2014, <http://www.magazines007.com/pdf/PCBD-Mar2014.pdf>.

* cited by examiner

SOLDER MASK VOID REGIONS FOR PRINTED CIRCUIT BOARDS

BACKGROUND

Printed circuit boards are used to structurally mount and electrically interconnect various electronic components. In some applications, a layer of solder mask may be applied to traces on the printed circuit board to protect the traces and components, as well as prevent solder shots on the printed circuit board.

DETAILED DESCRIPTION

Figure 1:
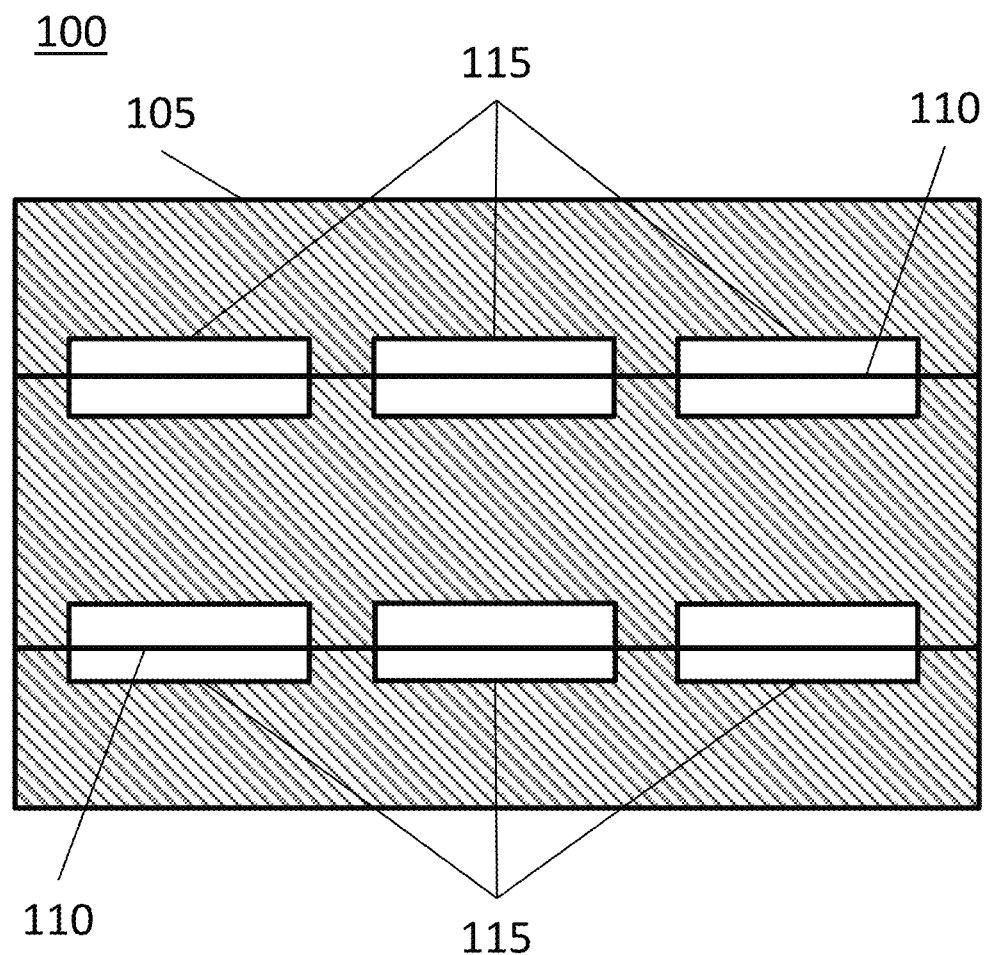
FIG. 1 is a planar, top view of a schematic representation of a printed circuit board in accordance with one or more example embodiments.

One or more examples are described in detail with reference to the accompanying figures. For consistency, like elements in the various figures are denoted by like reference numerals. In the following detailed description, specific details are set forth in order to provide a thorough understanding of the subject matter claimed below. In other instances, well-known features to one of ordinary skill in the art having the benefit of this disclosure are not described to avoid obscuring the description of the claimed subject matter.

Printed circuit board include layers of conductive and non-conductive materials that may be used to electrically connect electronic components structurally mounted to the printed circuit board. Such printed circuit boards are used extensively throughout various electronic products including computing products. As signal speed requirements for various applications increase, the need to decrease insertion loss, or the loss of signal power as components are added to a circuit, becomes a determinative parameter in printed circuit board design.

Signal frequency is another factor in insertion loss. As frequency increases, insertion losses increases and signal integrity is negatively impacted, thereby making longer trace lengths in certain components impracticable. For example, new generations of peripheral component interconnect express, otherwise known as PCIE, have speeds that will reach the 16 Ghz level. In order to maintain required signal strength, additional components, such as cables and re-timers are being used. However, the cost of such infrastructure makes the long-term viability of the solution untenable.

To prevent or decrease the need for additional components in such high-speed applications, printed circuit board design solutions to decrease insertion loss are described herein. Printed circuit boards use solder mask in order to protect the board and components as well as prevent solder shots and electrical shorts. While solder mask is a component that is useful in terms of protection, solder mask also includes fundamental properties that result in insertion loss. Solder mask that is used in the printed circuit board industry may have a relatively high dissipation factor. The higher the dissipation factor of the solder mask the greater dielectric loss in the circuit, which results in increased insertion loss. Insertion loss is determined by calculating the loss of signal power in a circuit as components are added to the circuit. Thus, as solder mask is added to a printed circuit board, the insertion loss for the board increases. Accordingly, by decreasing the amount of solder mask used on a printed circuit board, the insertion loss for the board may be decreased.

In conventional printed circuit board design, solder mask is used to cover as much of the conductive traces as possible, thereby providing a high level of protection against solder shots and other electrical shorts. To balance the protection offered by solder mask with the requirement of achieving higher signal strength in high-speed applications, the present disclosure presents a methodology for introducing void regions in the solder mask in order to decrease insertion loss. Such void regions may thereby decrease the total use of solder mask while balancing the protection solder mask affords with the insertion loss it introduces.

Turning to FIG. 1, a schematic representation of a printed circuit board according to an example embodiment is shown from a planar, top view. In this example, a printed circuit board 100 includes multiple layers of conductive and non-conductive materials not separately shown. Printed circuit boards 100, commonly referred to as PCBs, printed writing boards, or printed writing cards, electrically connect various connectors and components disposed thereon. As such, printed circuit boards allow signals and power to be routed between physical devices.

Printed circuit boards 100 may be constructed from a plurality of layers, which may be laminated together through the use of heat and adhesives. Exemplary layers may include a substrate layer, a conductive layer, a solder mask layer, and a silkscreen layer. The substrate layer may include a non-conductive material, such as fiberglass, onto which various other layers may be disposed.

Conductive layers (not independently illustrated) may include, for example, a copper layer that is laminated onto the substrate through the use of heat and adhesives. In certain printed circuit boards 100, conductive layers may be included on both sides of the substrate layer. In certain implementations, a number of conductive layers may be used, such as, for example, one, two, three, four, or more layers.

Printed circuit boards 100 may further include a solder mask layer 105. Solder mask 105 is a protective coating that may be applied to a bare printed circuit board 100 to prevent accidental solder bridging during assembly, prevent short circuits, and protect the printed circuit board 100 from the environment. Solder mask 105, which may also be referred to in the art as solder resist, is generally a lacquer-like polymer layer that is applied over conductive layers as a durable and lasting protective coating. Examples of types of solder mask 105 that may be used in examples of the present disclosure include but are not limited to epoxy liquid, liquid photoimageable ink, photoimageable dry film, and/or other types of solder mask 105 that may be applied as a thermosetting polymer, through silkscreening, or through vacuum lamination.

Silkscreen (not independently shown) is an outer layer that adds letters, number, symbols, and the like, thereby allowing for identification of components on the printed circuit board 100.

Referring again specifically to FIG. 1, printed circuit board 100 is shown having a layer of solder mask 105. Solder mask 105 is illustrated disposed over two electrically conductive traces 110. The traces 110 are areas of copper or other conductive materials, provided through, in, or on the conductive layer. The traces 100 provide a continuous path of conductive material that may be used to connect pads (not shown) or components (not shown) disposed on the printed circuit board 100.

As discussed above, solder mask 105 may be used to cover a substantial portion of printed circuit board 100. In the present example, solder mask 105 covers a portion of printed circuit board 100, however, a number of void regions 115 in the solder mask 105 are disposed around portions of the traces 110. Specifically, void regions 115 cover at least a portion of the area around the traces 110. Void regions 115 are areas of the printed circuit board 100 where solder mask 105 is excluded, thereby improving insertion loss for the printed circuit board 100. In this example, printed circuit board 100 includes six void regions 115, however, in other examples, fewer or greater numbers of void regions 115 may be used. Specific void regions 115 may be referred to herein as individual void regions 115. As illustrated, in this implementation, at least a portion of traces 100 are exposed by the location of void regions 115.

The total area of solder mask 105, i.e., the solder mask layer area, on printed circuit board 100 according to examples of the present disclosure may vary depending on the requirements for the implementation. For example, in certain applications, void region 115 may encompass ninety-nine (99) percent of the total area of the solder mask layer 105. In other implementations, void region 115 may cover between five (5) percent and twenty (20) percent of the total area of the solder mask layer 105. In still other implementations, void region 115 may cover more than five (5) percent of the total area of the solder mask layer 105. In certain implementations, void region 115 may cover an amount of the total area of the solder mask layer 105 in excess of one (1) percent. The void regions 115 may vary by size and location, thereby allowing a designer to balance having enough solder mask to prevent solder shots, electrical shorts, and/or not provide sufficient, protection with the requirement to decrease insertion loss in particular applications.

By increasing the ratio of void region 115 relative to solder mask 105, insertion loss for the printed circuit board 100 may be lessened, thereby improving the signal integrity margin. Depending on the implementation, the ratio of void region 115 relative to solder mask 105 may be varied to balance the decrease in signal loss due to void regions 115 with the preventative aspects of solder mask 105. Determining the ratio of void region 115 relative to solder mask 105 will be discussed in detail with respect to FIG. 2.

Figure 2:
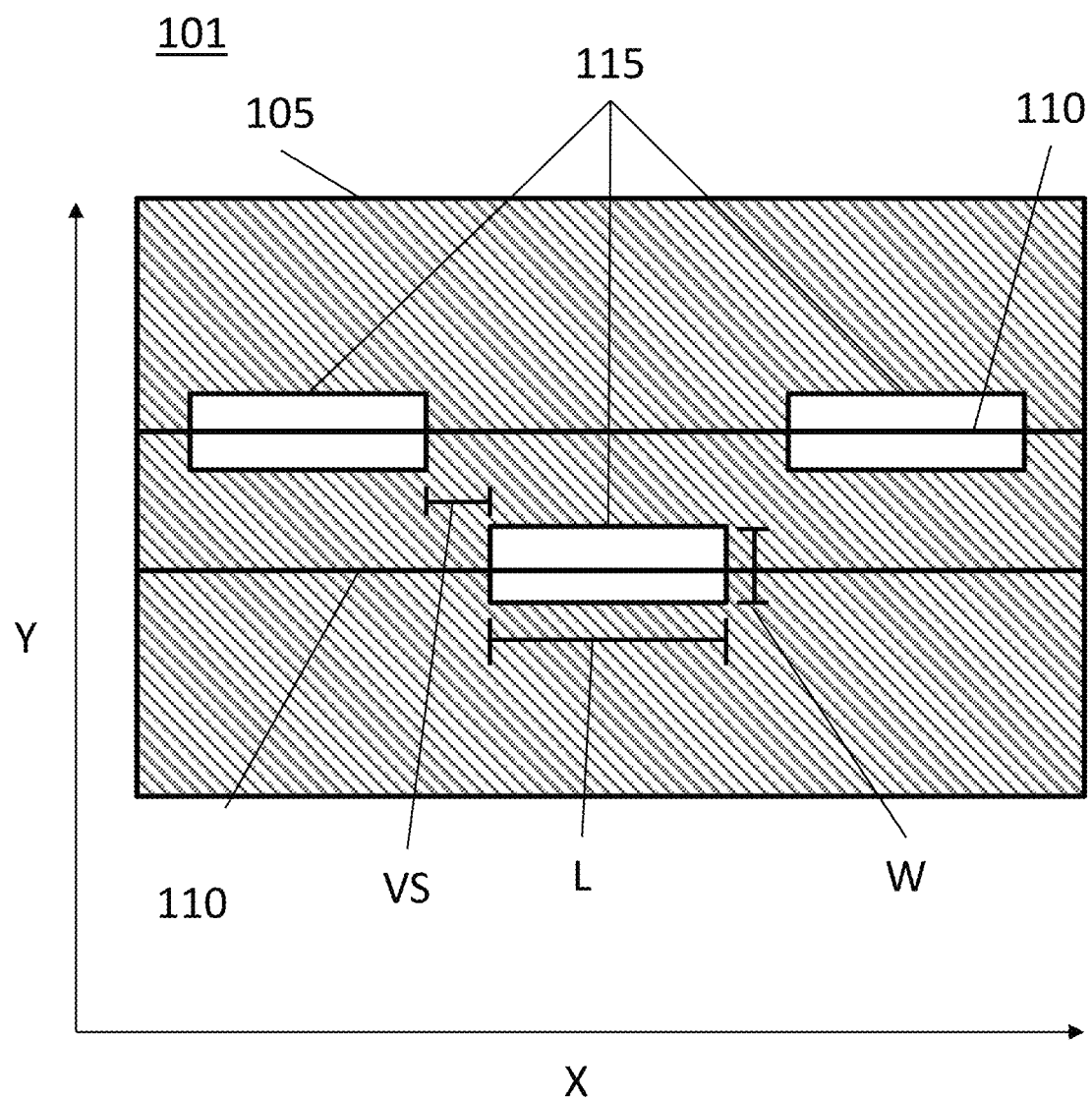
FIG. 2 is a planar, top view of a schematic representation of a printed circuit board in accordance with one or more example embodiments.

Referring to FIG. 2, a schematic representation of a printed circuit board according to another example embodiment is shown. In this example, printed circuit board 101 includes a solder mask layer 105, two (2) electrically conductive traces 110, and three (3) void regions 115. The void regions 115 are illustrated staggered with respect to each other, thereby providing increased protection from solder bridges and short circuits. In this example, void regions 115 are staggered with respect to each other along both an X-axis and a Y-axis, thereby providing solder mask 105 between each individual void region 115. The orientation, e.g., staggering in this instance, of void regions 115 may be varied in order to achieve an acceptable signal loss while maintaining manufacturing integrity. Because there is solder mask 105 disposed between each individual void region 115, during manufacturing there may be a decreased likelihood of solder shots resulting in short circuits and thus defective printed circuit boards 101. In alternative implementations the staggering of void regions 115 may include different lengths and widths for each void region 115, may include fewer or greater numbers of void regions 115, and/or may include varying the amount of solder mask 105 between void regions 115.

As one example, the width, length, and spacing dimensions of void spaces 115 relative to solder mask 105 will be discussed herein in detail. In this implementation void spaces 115 have a void length (L) of 250 mils and a void width (W) of 9 mils. The space between void regions (VS) is 25 mils. Accordingly, in this example, the ratio of void region 115 to solder mask 105, i.e., the void ratio, is 5:1 (determined by dividing the void length (L) by the space between void regions (VS) on both sides of an individual void region, 250/(25+25)). In other implementations, this ratio may be varied in order to achieve the desired balance between signal loss and manufacturing integrity. For example, in alternative implementations, the ratio may be 2:1, 3:1, 4:1, 6:1, 7:1, 8:1, 9:1, 10:1 or greater than 10:1 and/or any ratio therebetween. In certain implementations, the ratios may also be less than 2:1, such as 1:1, 0.5:1, less than 0.5:1 and/or any ratio therebetween.

For completeness, in other examples, the void length (L) may be 250 mils, while the space between void regions (VS) may be 12.5 mils, thereby providing a void ratio of 10:1. In other implementations, the space between void regions may be smaller, for example, 3 mils, and the void length (L) may be greater, for example, 60 mils, thereby providing a void ratio of 20:1. As discussed above, the void ratio may be adjusted according to the requirements of a particular printed circuit board 101.

Figure 3:
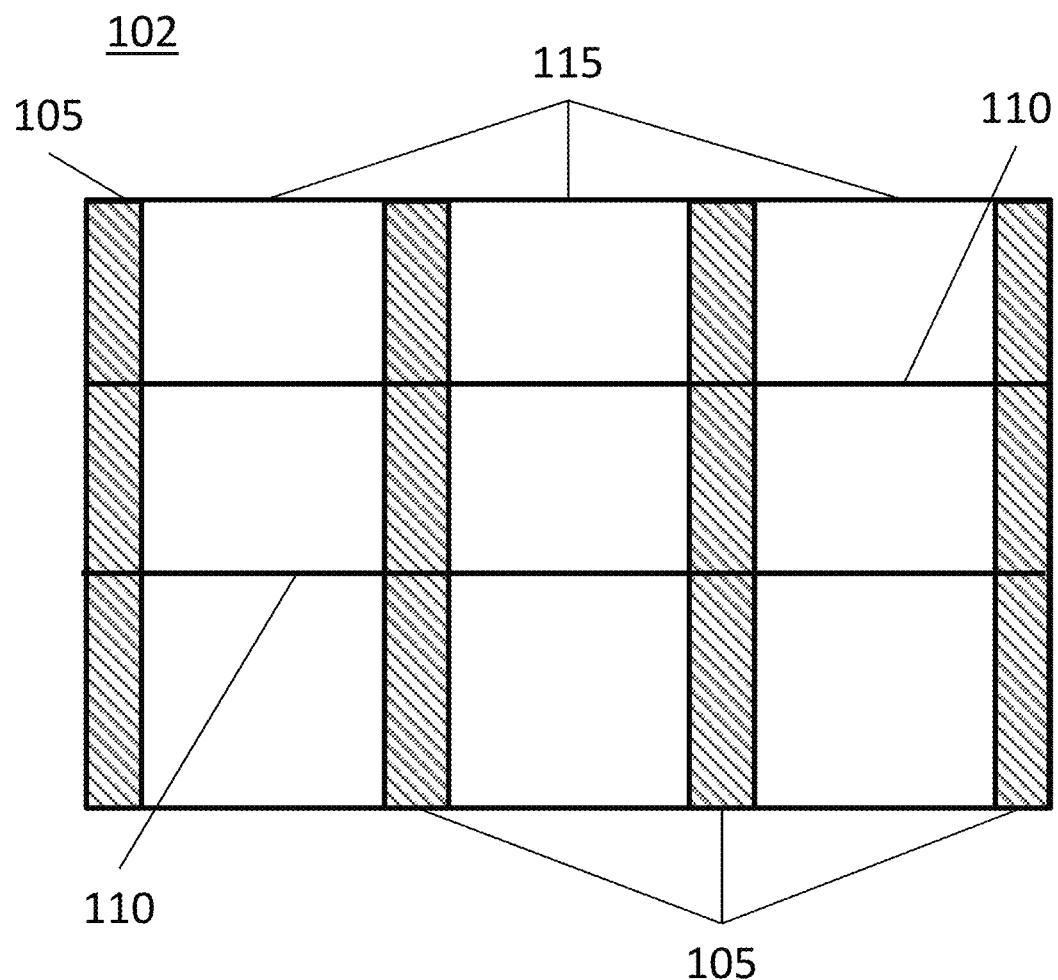
FIG. 3 is a planar, top view of a schematic representation of a printed circuit board in accordance with one or more example embodiments.

Referring to FIG. 3, a schematic representation of a printed circuit board according to another example embodiment is shown. In this example, printed circuit board 102 includes a solder mask layer 105, two (2) electrically conductive traces 110, and three (3) void regions 115. Unlike the example in FIG. 1, the void regions 115 occupy the majority of the surface area of printed circuit board 102. Accordingly, small areas of solder mask 105 are used to separate relatively large void regions 115. Because solder mask 105 results in loss in signal power, and thus insertion loss, such an implementation may be used to decrease insertion loss, thereby increasing signal strength while separating traces 110 and preventing electrical shorts.

Figure 4:
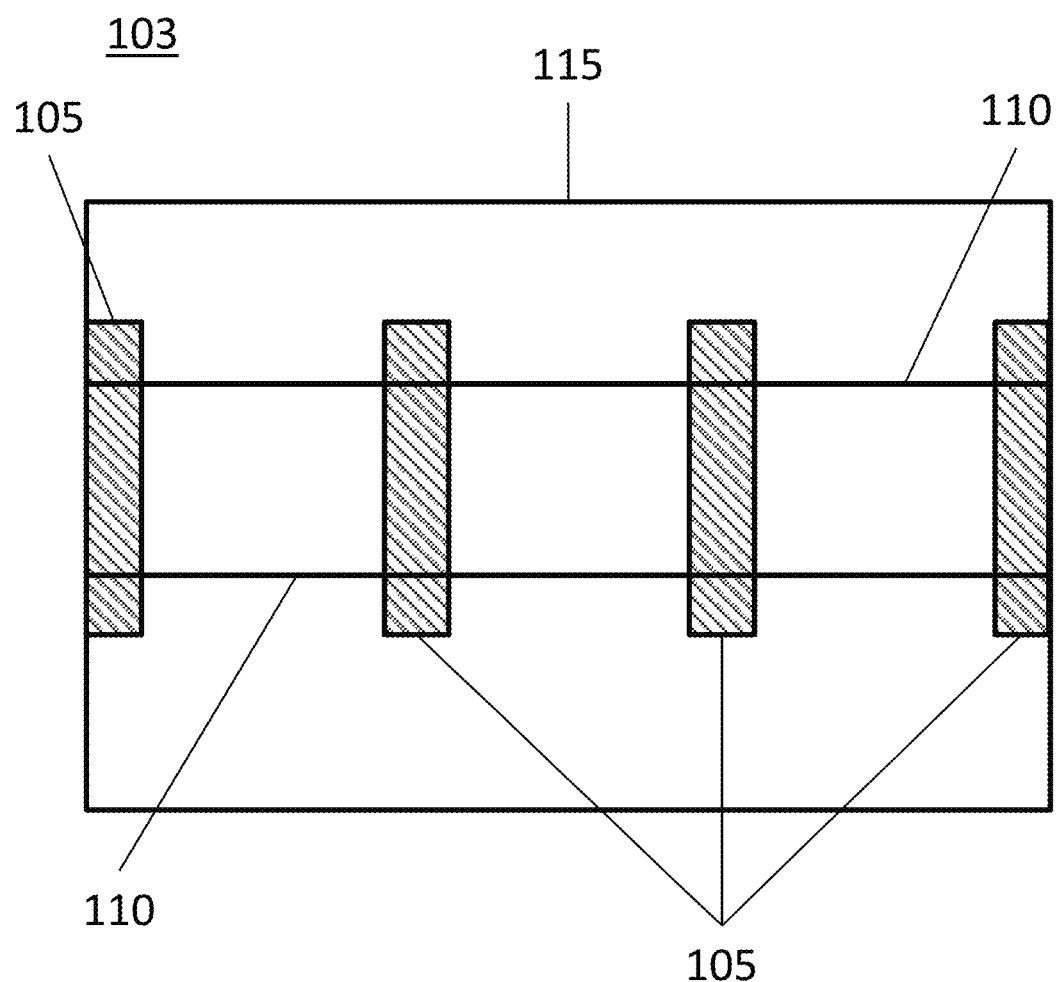
FIG. 4 is a planar, top view of a schematic representation of a printed circuit board in accordance with one or more example embodiments.

Referring to FIG. 4, a schematic representation of a printed circuit board according to another example embodiment. In this example, printed circuit board 103 includes a solder mask layer 105, two (2) electrically conductive traces 110, and three (3) void regions 115. In such an implementation, relatively small amounts of solder mask 105 may be used, thereby providing a relatively high void ratio. In such an implementation, by using relatively small amounts of solder mask, the insertion loss may be significantly reduced, thereby enhancing signal strength for high-speed applications. Additionally, by using strategically placed sections of solder mask, the board may be protected from solder shots or other electrical shorts during manufacturing, thereby providing the benefits provided by solder mask while not introducing additional signal power losses to the circuit.

Figure 5:
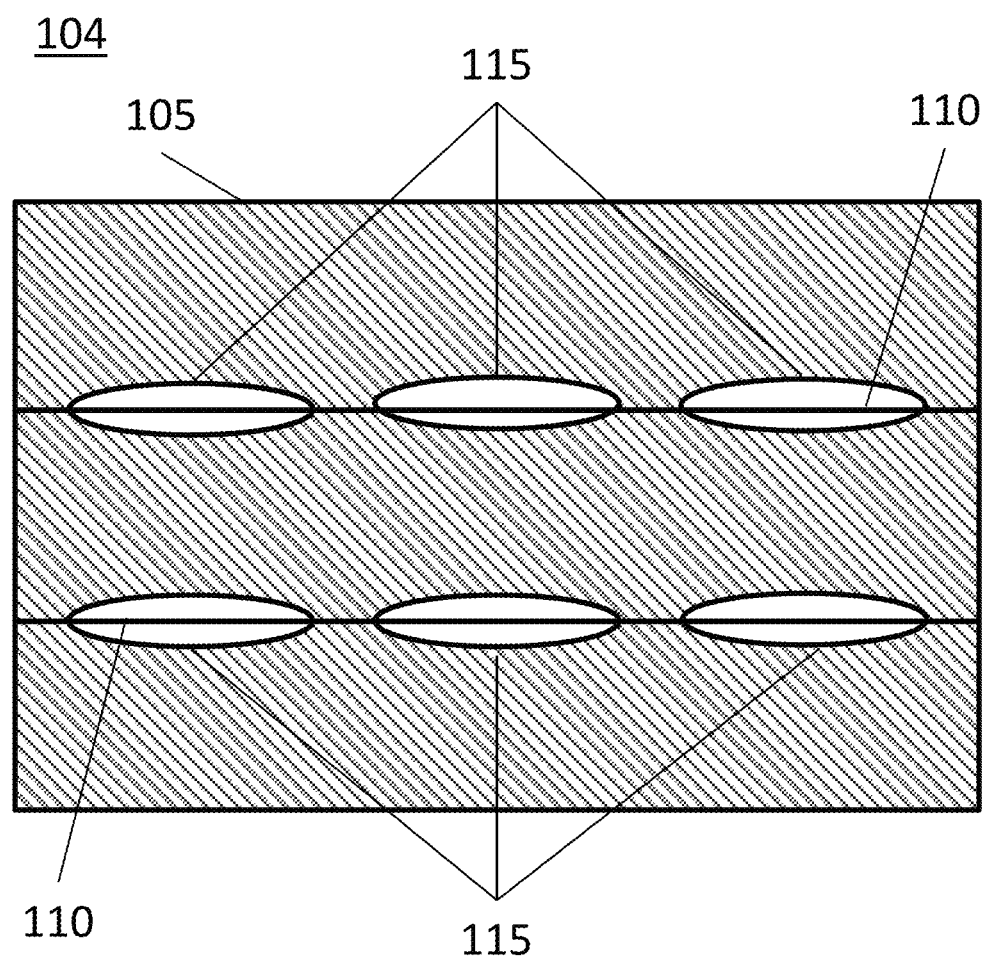
FIG. 5 is a planar, top view of a schematic representation of a printed circuit board in accordance with one or more example embodiments.

Referring to FIG. 5, a schematic representation of a printed circuit board according to another example embodiment is shown. In this example, printed circuit board 104 includes a solder mask layer 105, two (2) electrically conductive traces 110, and three (3) void regions 115. In this example, the void regions 115 have an oblong geometric profile. By varying the geometric profile, different void ratios may be achieved, thereby allowing for the mitigation of insertion loss for a particular implementation. In alternative implementations, the geometric profile of void region 115 may include various alternative profiles, such as, for example, angular profiles (including right angle profiles), arcuate profiles, and combinations thereof.

Figure 6:
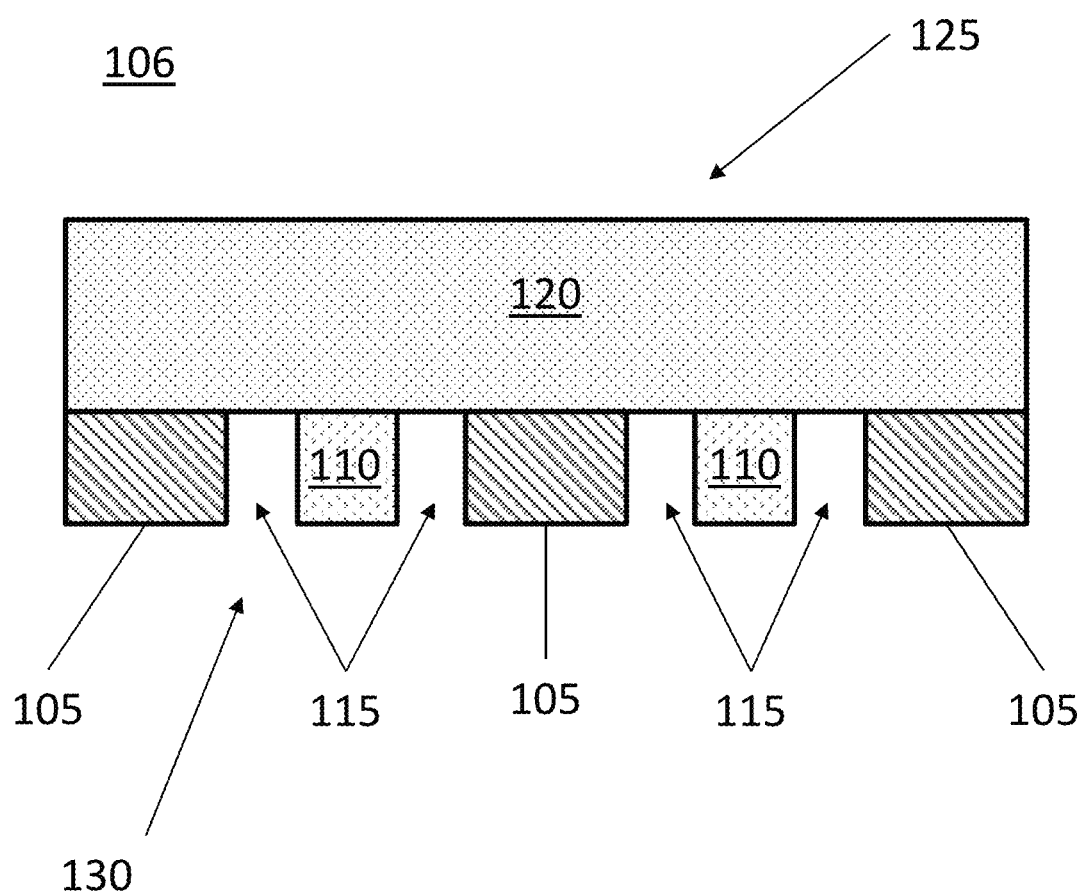
FIG. 6 is a planar end view of a printed circuit board in accordance with one or more example embodiments.

Referring to FIG. 6, a planar end view of a printed circuit board according to another example embodiment is shown. In this example, printed circuit board 106 includes a solder mask layer 105, two (2) electrically conductive traces 110, and three (3) void regions 115. This implementation also illustrates substrate layer 120, onto which the other layers are disposed. In certain implementations, rather than dispose solder mask layer 105 and the traces 110 on the top side 125 of the substrate layer 120, the solder mask layer 105 and the traces 110 may be disposed on the basal side 130 of the substrate layer 120. Accordingly, the traces 110 may be protected from the environment because the substrate layer 120 is disposed above the traces 110 and falling objects are not capable of contacting the traces, thereby causing electrical shorts, etc.

Because the traces 110 on the basal side 130 are protected from the environment, relatively lower areas of solder mask 105 may be required and the void ratio may be increased. For example, in such an implementation, the void region may include between fifty (50) percent and ninety-nine (99) percent of the total area of the solder mask layer. Those of ordinary skill in the art having benefit of the present disclosure will appreciate that the void ratio and the relative percentages of void region to solder mask layer may be varied to balance the decreasing insertion loss while providing necessary electrical protection.

Figure 7:
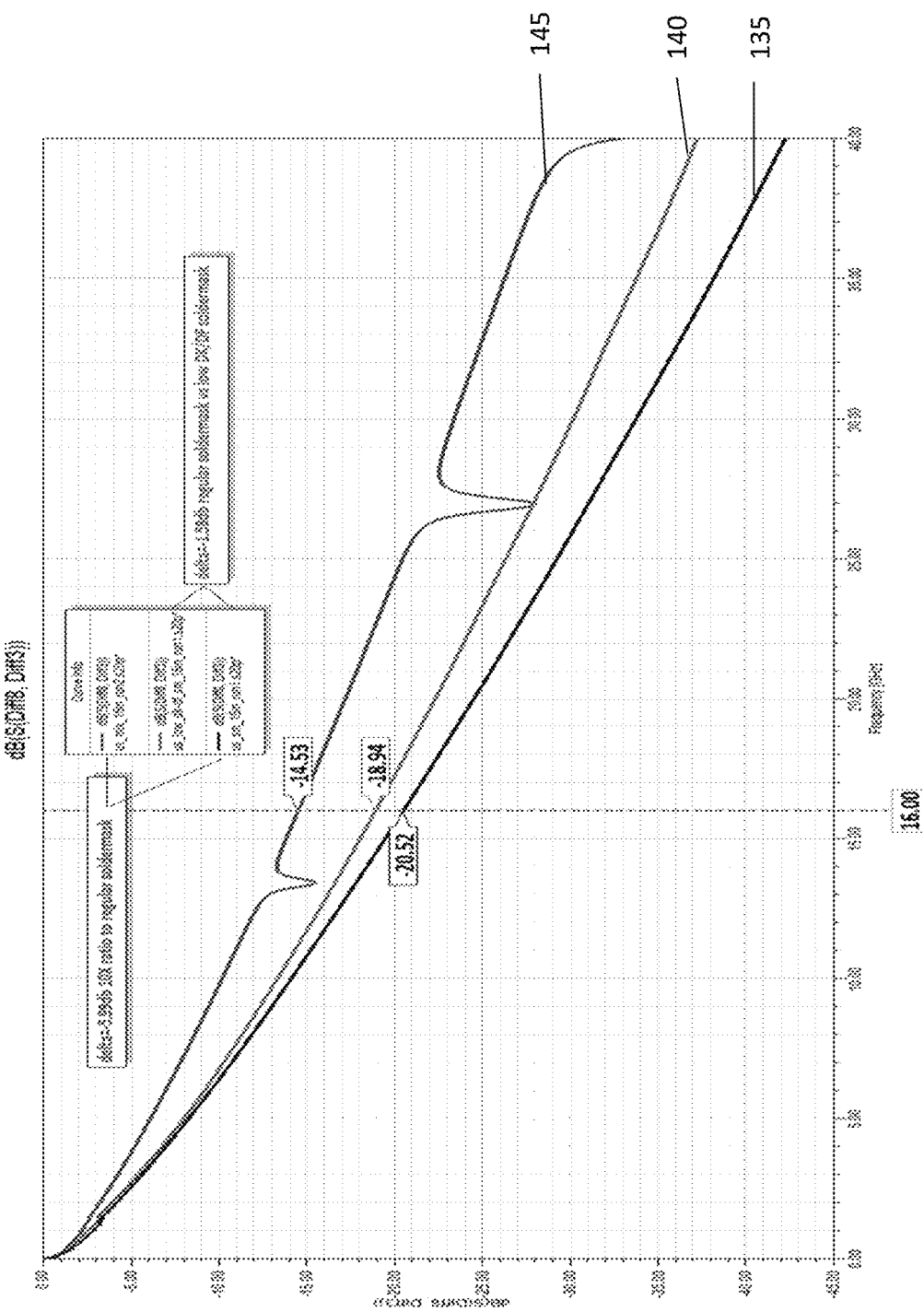
FIG. 7 shows a graph of insertion loss at varied frequencies of solder mask orientations in accordance with one or more example embodiments.

Referring to FIG. 7, a graph of insertion loss at varied frequencies of solder mask orientations according to an example embodiment is shown. Insertion loss is illustrated in FIG. 7 as a decibel loss (y-axis) at a defined frequency (x-axis) based on the type of printed circuit board design used. Three different printed circuit board designed are graphed relative to one another in FIG. 7. Line 135 shows a graphical representation, of the insertion loss from 0.00 GHz to 40.0 Ghz for a system using solder mask in a particular application. At 16.0 Ghz, the insertion loss for such a system is 20.52 dB.

Line 140 shows a graphical representation of the insertion loss from 0.00 GHz to 40.0 Ghz for a system using low dissipation solder mask. At 16.0 Ghz, the insertion loss for such a system is 18.94 dB. Line 145 shows a graphical representation of the insertion loss from 0.00 GHz to 40.0 Ghz for a system using a 10:1 ratio of void space to solder mask. At 16.0 Ghz, the insertion loss for such a system is 14.53 dB.

Reviewing the study graphically represented in FIG. 7, by using void regions having a void ratio of 10:1, the insertion loss at 16.0 Ghz may be decreased by 5.99 dB. By decreasing the insertion loss for high speed signals, such as those at and above 16.0 Ghz, longer trace lengths may be used without the need for other components, such as cables and/or re-timers.

Figure 8:
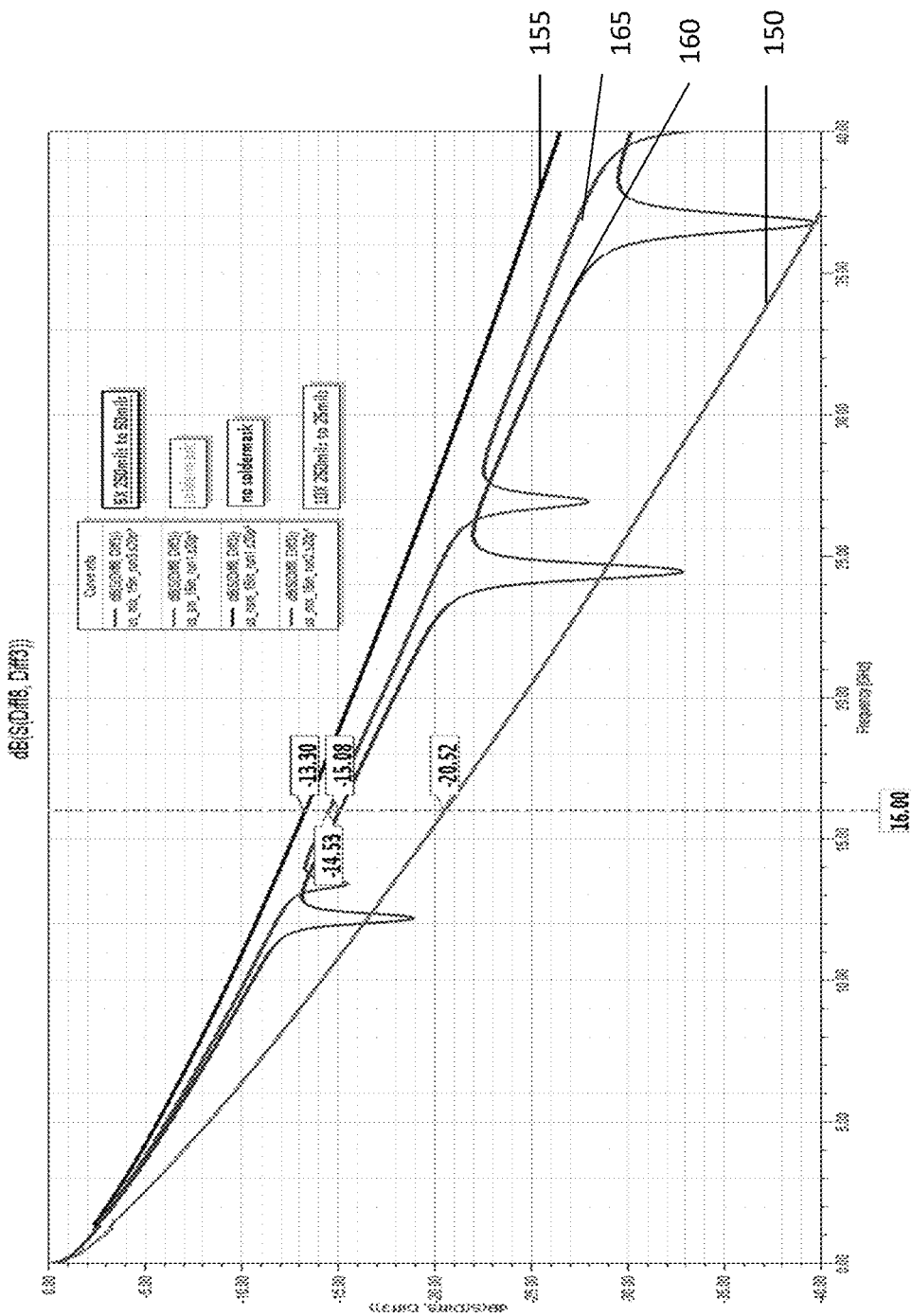
FIG. 8 shows a graph of insertion loss at varied frequencies of solder mask orientations in accordance with one or more example embodiments.

Referring to FIG. 8, a graph of insertion loss at varied frequencies of solder mask orientations according to an example embodiment is shown. Insertion loss is illustrated in FIG. 8 as a decibel loss (y-axis) at a defined frequency (x-axis) based on the type of printed circuit board design used. Four different printed circuit board designed are graphed relative to one another in FIG. 8. Line 150 shows a graphical representation of the insertion loss from 0.00 GHz to 40.0 Ghz for a system using solder mask in a particular application. At 16.0 Ghz, the insertion loss for such a system is 20.52 dB.

Line 155 shows a graphical representation of the insertion loss from 0.00 GHz to 40.0 Ghz for a system using no solder mask. At 16.0 Ghz, the insertion loss for such a system is 13.3 dB. Line 160 shows a graphical representation of the insertion loss from 0.00 GHz to 40.0 Ghz for a system using a 10:1 ratio of void space to solder mask. At 16.0 Ghz, the insertion loss for such a system is 14.53 dB, Line 165 shows a graphical representation of the insertion loss from 0.00 GHz to 40.0 Ghz for a system using a 5:1 ratio of void space to solder mask. At 16.0 Ghz, the insertion loss for such a system is 15.08 dB.

Reviewing the study graphically represented in FIG. 8, by using void regions having a void ratio of 10:1, the insertion loss at 16.0 Ghz may be decreased by 5.99 dB. While somewhat less, using void regions having a void ratio of 5:1, the insertion loss at 16.0 Ghz may be decreased by 5.44 dB. By decreasing the insertion loss for high speed signals, such as those at and above 16.0 Ghz, longer trace lengths may be used without the need for other components, such as cables and/or re-timers. However, the study illustrated in FIG. 8 shows that the differences between a 10:1 and a 5:1 void ratio system, i.e., 0.55 dB, may provide little difference, thereby allowing a designer to take into consideration the gains in signal strength maintained by using a relatively higher void ratio with the potential manufacturing and operational concerns of less solder mask.

Figure 9:
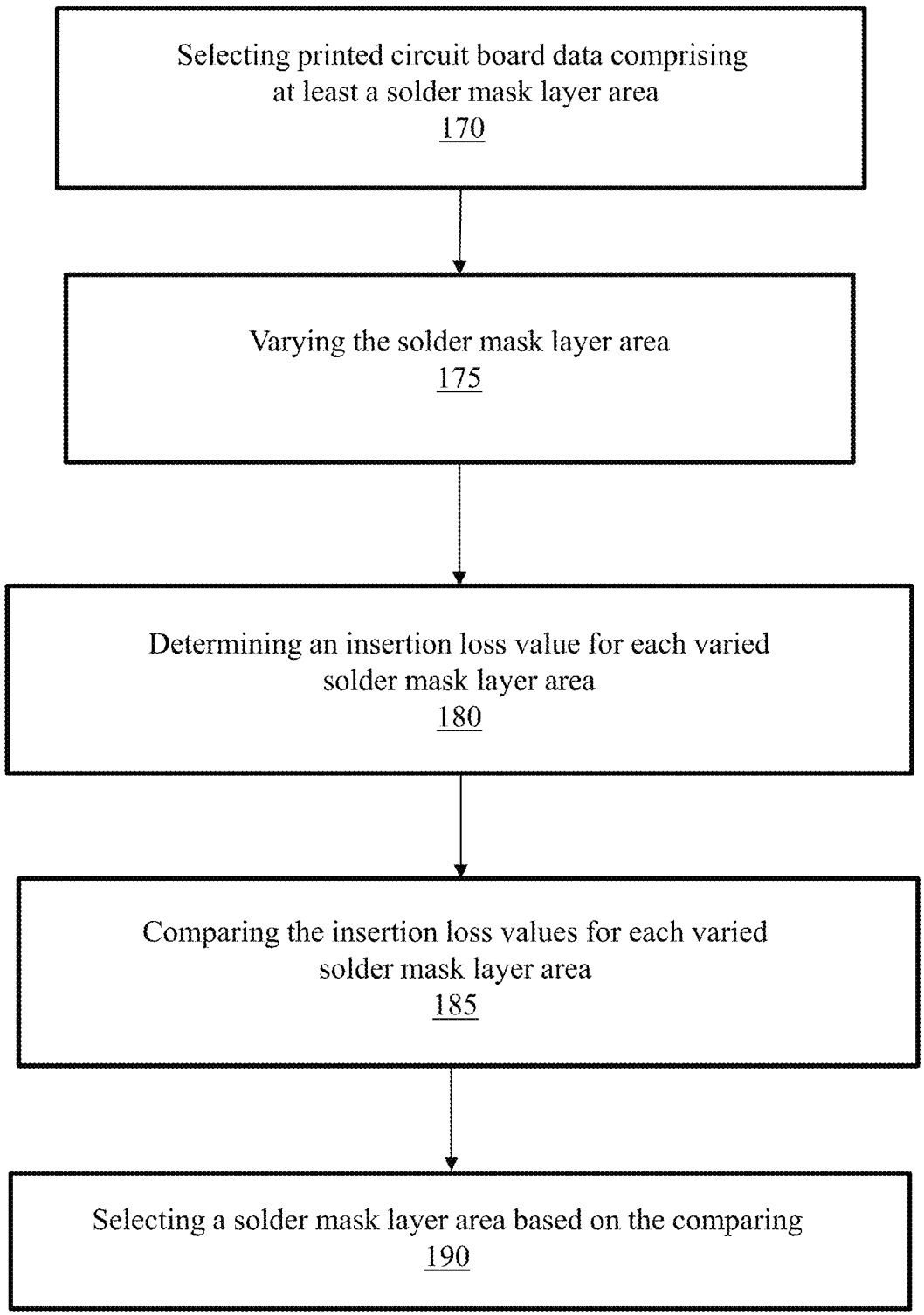
FIG. 9 shows a block diagram of a method of optimizing printed circuit board design in accordance with one or more example embodiments.

Referring to FIG. 9, a block diagram of a method of optimizing printed circuit board design in accordance with one or more example embodiments is shown. In such a method, initially a designer may select (170) printed circuit board data that includes at least a solder mask layer area. In addition to the printed circuit board data including a solder mask layer area, the data may further include a frequency, a length of a void region, a width of a void region, a solder mask material, a solder mask layer location, a cost factor, a materials factor, a chance in speed, a signal loss, and other design parameters known to those of ordinary skill in the art.

The solder mask layer area may then be varied (175), such that multiple solder mask areas are defined. In certain implementations, varying (175) the solder mask area may include selecting a first solder mask layer area having a first are of solder mask and selecting a second solder mask layer area having a second area of solder mask where the first and second areas of solder mask are different. For example, the first area of solder mask may be greater than the second area of solder mask.

An insertion loss value for each of the varied solder mask layer areas may then be determined (180), at which point the insertion loss values for each varied solder layer area may be compared (185). A solder mask layer area may then be selected (190) based on the comparison of the insertion loss values for each of the varied (175) solder mask layer areas.

As discussed above, determining the insertion loss values for each of the varied solder mask layer areas may include determining a decibel loss at a particular frequency. This methodology is defined, at least in part, in the graphical illustrations in FIGS. 7 and 8. By varying the void ratios and determining the insertion loss for each printed circuit board, a desired balance between performance increase and potential manufacturing and operational issues may be determined.

In certain implementations a particular void region, pattern may be selected and the insertion loss value for the selected void region pattern may be independently determined. By determining the insertion loss for a particular void region pattern, a pattern that is optimized for the printed circuit board may be determined. The optimized void pattern may then be used across multiple platforms as a base determination during optimization, thereby further increasing the efficiency of design optimization.

Part of void pattern optimization may further include selecting a second void region pattern, determining the insertion loss value for the selected second void region pattern, and comparing the insertion loss values for the void region pattern and the second void region pattern. By comparing multiple void region patterns, a best fit for a particular printed circuit board may be determined. Those of ordinary skill in the art having benefit of the present disclosure will appreciate that testing numerous void region patterns may be beneficial in determining an optimized void region pattern for a particular printed circuit board.

To optimize printed circuit board design using the methodology described in detail above, the steps of varying, determining, and comparing may be continued until the optimized printed circuit board design is determined. An optimized printed circuit board design may include design variants that balance the requirements of protection of the board from the environment and prevention of electrical shorts with a desired decrease in insertion loss that allows for better signal strength in higher frequency applications.

Figure 10:
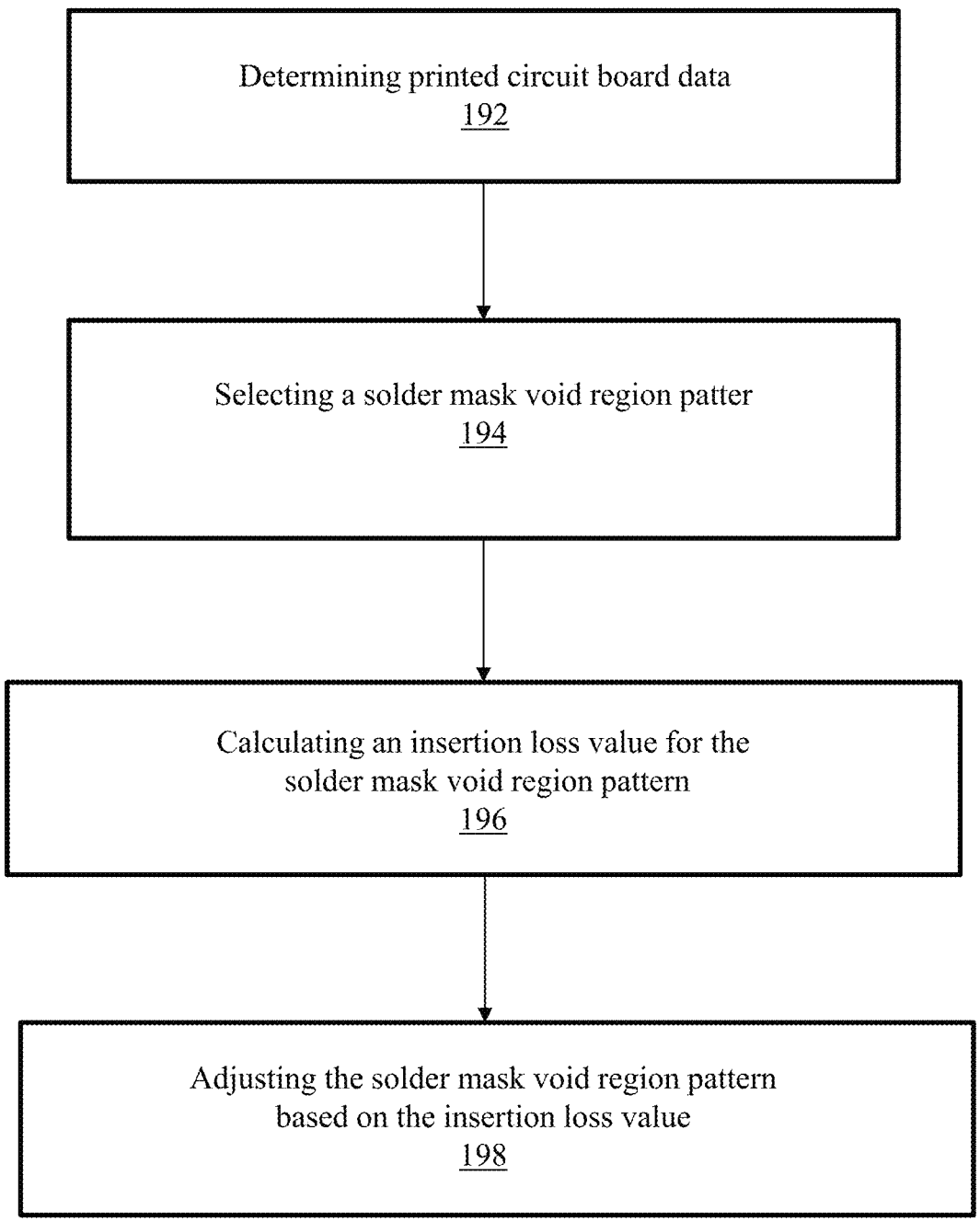
FIG. 10 shows a block diagram of a method of designing printed circuit board in accordance with one or more example embodiments.

Referring to FIG. 10, a block diagram of a method of designing printed circuit boards in accordance with one or more example embodiments are shown. In designing printed circuit boards, a designer may initially determine (192) printed circuit board data. The printed circuit board data may include various factors such as, for example, a solder mask layer area, the data may further include a frequency, a length of a void region, a width of a void region, a solder mask material, a solder mask layer location, a cost factor, a materials factor, a chance in speed, a signal loss, and other design parameters known to those of ordinary skill in the art.

After the printed circuit board data is determined (192), a solder mask void region pattern may be selected (194). The solder mask void region pattern may serve as a starting point for determining an optimized final solder void region pattern for the particular printed circuit board. In certain implementations, the selected (194) solder mask void region pattern may be selected (194) based on known parameters from the printed circuit board data. For example, the solder mask void region pattern may be selected (194) from a database of patterns that were previously used in similar printed circuit boards. In other implementations, the solder mask void region pattern may be a new design that has not been previously used.

After the solder mask void region pattern is selected (194), an insertion loss value for the solder mask void region pattern may be calculated (196). The calculation (196) may follow the methodology described above with respect to the studies graphically illustrated in FIGS. 7 and 8. Generally, the insertion loss may be calculated (196) by determining the decibel loss at a particular frequency for a printed circuit board having a particular selected (194) solder mask region pattern. The printed circuit board data may be used in determining either a percentage of void regions relative to area of solder mask, a ratio of void regions to solder mask, or combinations thereof. Both the methodology to determine percentage of void regions relative to area of solder mask and the determination of a ratio of void regions to solder mask are described in detail above with respect to FIGS. 1 and 2.

The solder mask void region pattern may then be adjusted (198) based on the calculated (196) insertion loss value. For example, if a ratio of 5:1 void region space to solder mask resulted in an insertion loss value that was higher than desired, the ratio could be increased to 10:1 and recalculated. The process for determining a desired solder mask void region pattern may be iteratively recalculated until a desired result is achieved. In certain implementations, adjusting (198) the solder mask void region pattern may further include adjusting an area of solder in the solder mask layer. Those of ordinary skill in the art having benefit of the present disclosure will appreciate that any solder mask void region pattern aspect may be adjusted in order to achieve a desired outcome. In addition to solder mask area and ratio of void regions to solder mask, the orientation of the void regions, the geometry of the void regions, the location of the void regions, the staggering of the void regions, and other aspects of void region design may be modified to achieve a desired balance of insertion loss to board integrity. For example, in certain implementations the final solder mask void region pattern for a particular design may include a plurality of individual void regions separated by at least one solder mask barrier, while in other implementations, the design may include a printed circuit board where void region patterns include at least one (1) percent of the solder mask layer area.

The optimization and design of printed circuit boards using the methodology described herein may benefit from optimization using various hardware and software tools known to those of ordinary skill in the art. For example, simulation and optimization software may be used for speed and accuracy during iterative simulation. Examples of software solutions that may be used during design and optimization may include, software using recursive and/or deterministic algorithms, operating through neural net-based interfaces. In certain implementations, optimization may occur using stochastic and/or organic algorithms based on the level of precision required for a particular optimization or design. Examples of hardware that may be used during design, optimization, testing, implementation, and the like are described in detail below.

Figure 11:
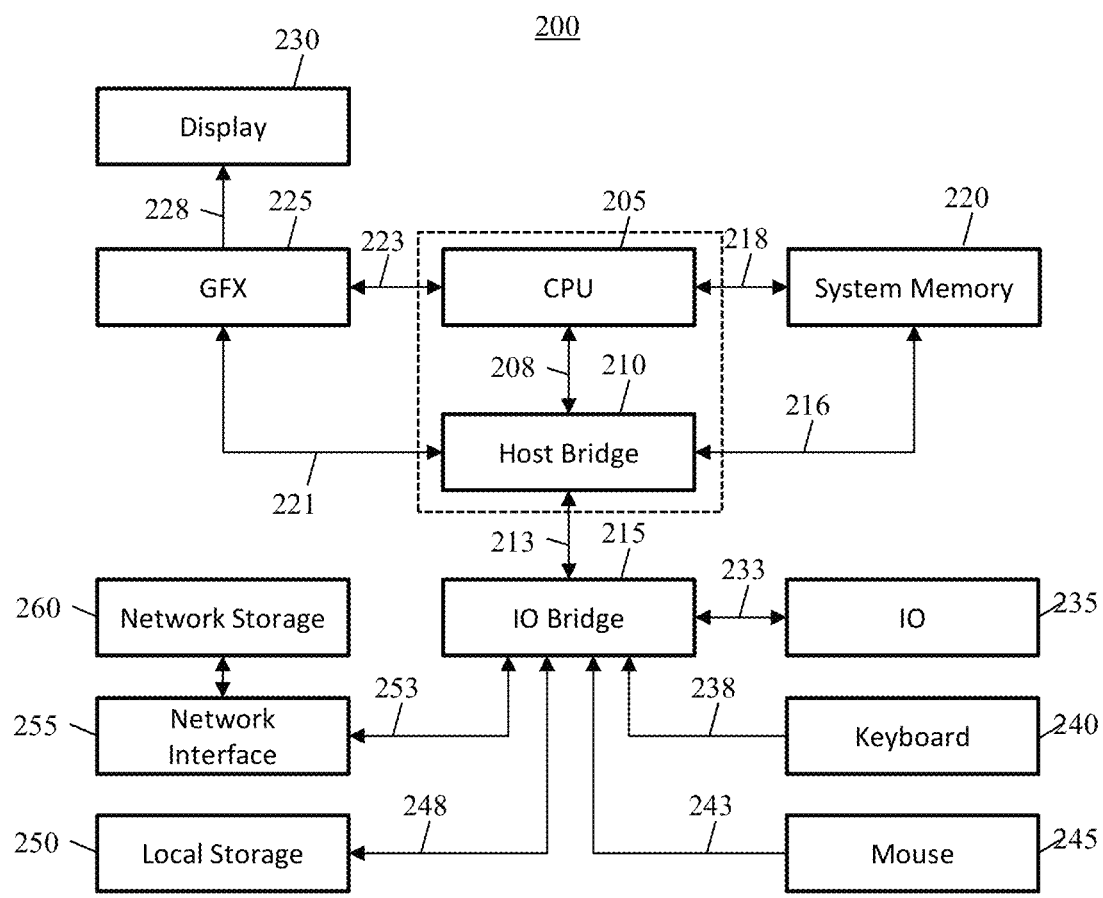
FIG. 11 shows a schematic representation of a general-purpose computing system that may be used in accordance with one or more example embodiments.

FIG. 11 shows a computing system 200 in accordance with one or more example embodiments. Computing system 200 may include one or more central processing units (singular "CPU" or plural "CPUs") 205 disposed on one or more printed circuit boards (not otherwise shown). Each of the one or more CPUs 205 may be a single-core processor (not independently illustrated) or a multi-core processor (not independently illustrated). Multi-core processors typically include a plurality of processor cores (not shown) disposed on the same physical die (not shown) or a plurality of processor cores (not shown) disposed on multiple die (not shown) that are collectively disposed within the same mechanical package (not shown). Computing system 200 may include one or more core logic devices such as, for example, host bridge 210 and input/output ("IO") bridge 215.

CPU 205 may include an interface 208 to host bridge 210, an interface 218 to system memory 220, and an interface 223 to one or more IO devices, such as, for example, graphics processing unit ("GFX") 225. GFX 225 may include one or more graphics processor cores (not independently shown) and an interface 228 to display 230. In certain embodiments, CPU 205 may integrate the functionality of GFX 225 and interface directly (not shown) with display 230. Host bridge 210 may include an interface 208 to CPU 205, an interface 213 to IO bridge 215, for embodiments where CPU 205 does not include interface 218 to system memory 220, an interface 216 to system memory 220, and for embodiments where CPU 205 does not include integrated GFX 225 or interface 223 to GFX 225, an interface 221 to GFX 225. One of ordinary skill in the art will recognize that CPU 205 and host bridge 210 may be integrated, in whole or in part, to reduce chip count, motherboard footprint, thermal design power, and power consumption. IO bridge 215 may include an interface 213 to host bridge 210, one or more interfaces 233 to one or more IO expansion devices 235, an interface 238 to keyboard 240, an interface 243 to mouse 245, an interface 248 to one or more local storage devices 250, and an interface 253 to one or more network interface devices 255.

Each local storage device 250 may be a solid-state memory device, a solid-state memory device array, a hard disk drive, a hard disk drive array, or any other non-transitory computer readable medium. Each network interface device 255 may provide one or more network interfaces including, for example, Ethernet, Fibre Channel, WiMAX, Wi-Fi, Bluetooth, or any other network protocol suitable to facilitate networked communications. Computing system 200 may include one or more network-attached storage devices 260 in addition to, or instead of, one or more local storage devices 250. Network-attached storage device 260 may be a solid-state memory device, a solid-state memory device array, a hard disk drive, a hard disk drive array, or any other non-transitory computer readable medium. Network-attached storage device 260 may or may not be collocated with computing system 200 and may be accessible to computing system 200 via one or more network interfaces provided by one or more network interface devices 255.

One of ordinary skill in the art will recognize that computing system 200 may include one or more application specific integrated circuits ("ASICs") that are configured to perform a certain function, such as, for example, hashing (not shown), in a more efficient manner. The one or more ASICs may interface directly with an interface of CPU 205, host bridge 210, or IO bridge 215. Alternatively, an application-specific computing system (not shown), sometimes referred to as mining systems, may be reduced to only those components necessary to perform the desired function, such as hashing via one or more hashing ASICs, to reduce chip count, motherboard footprint, thermal design power, and power consumption. As such, one of ordinary skill in the art will recognize that the one or more CPUs 205, host bridge 210, IO bridge 215, or ASICs or various subsets, supersets, or combinations of functions or features thereof, may be integrated, in whole or in part, or distributed among various devices in a way that may vary based on an application, design, or form factor in accordance with one or more example embodiments. As such, the description of computing system 200 is merely exemplary and not intended to limit the type, kind, or configuration of components that constitute a computing system suitable for performing computing operations, including, but not limited to, hashing functions. Additionally, one of ordinary skill in the art will recognize that computing system 200, an application specific computing system (not shown), or combination thereof, may be disposed in a standalone, desktop, server, or rack mountable form factor.

One of ordinary skill in the art will recognize that computing system 200 may be a cloud-based server, a server, a workstation, a desktop, a laptop, a netbook, a tablet, a smartphone, a mobile device, and/or any other type of computing system in accordance with one or more example embodiments.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

While the present teachings have been described in conjunction with various examples, it is not intended that the present teachings be limited to such examples. The above-described examples may be implemented in any of numerous ways.

Also, the technology described herein may be embodied as a method, of which at least one example has been provided. The acts performed as part of the method may be ordered in any suitable way. Accordingly, examples may be constructed in which acts are performed in an order different than illustrated, which may include performing some acts simultaneously, even though shown as sequential acts in illustrative examples.

Advantages of one or more example embodiments may include one or more of the following:

In one or more examples, apparatuses, systems, and methods disclosed herein may be used to decrease insertion loss in a printed circuit board.

In one or more examples, apparatuses, systems, and methods disclosed herein may be used to provide longer routing lengths and eliminate the need for signal conditioning silicon, such as re-timers, in printed circuit boards.

In one or more examples, apparatuses, systems, and methods disclosed herein may be used to decrease the cost of producing printed circuit boards In one or more examples, apparatuses, systems, and methods disclosed herein may be used to extend PCIE, UPI, memory buss, and/or any high-speed trace lengths.

In one or more examples, apparatuses, systems, and methods disclosed herein may be used to increase signal integrity margin.

Not all embodiments will necessarily manifest all these advantages. To the extent that various embodiments may manifest one or more of these advantages, not all of them will do so to the same degree.

While the claimed subject matter has been described with respect to the above-noted embodiments, those skilled in the art, having the benefit of this disclosure, will recognize that other embodiments may be devised that are within the scope of claims below as illustrated by the example embodiments disclosed herein. Accordingly, the scope of the protection sought should be limited only by the appended claims.

What is claimed is:

1. A printed circuit board comprising:
a substrate layer;
at least one electrically conductive trace disposed on the substrate layer; and
a solder mask layer disposed over the substrate layer and the electrically conductive trace, wherein the solder mask layer includes one or more void regions and one or more solder mask regions over at least a portion of the electrically conductive trace, and the ratio of the total length of the one or more void regions to the total length of the one or more solder mask regions over at least the portion of the electrically conductive trace is greater than or equal to 10:1.

2. The printed circuit board of claim 1, wherein the one or more void regions comprises more than one percent of the total area of the solder mask layer.

3. The printed circuit board of claim 1, wherein the one or more void regions comprises between five percent and twenty percent of the total area of the solder mask layer.

4. The printed circuit board of claim 1, wherein the one or more void regions comprises between twenty percent and fifty percent of the total area of the solder mask layer.

5. The printed circuit board of claim 1, wherein the solder mask layer is disposed on a basal side of the printed circuit board.

6. The printed circuit board of claim 1, wherein the one or more void region regions comprises a plurality of individual void regions separated by at least one solder mask barrier.

* * * * *